United States Patent
Slezak et al.

(10) Patent No.: US 6,430,719 B1
(45) Date of Patent: *Aug. 6, 2002

(54) GENERAL PORT CAPABLE OF IMPLEMENTING THE JTAG PROTOCOL

(75) Inventors: Yaron Slezak, Kiriat Motzkin (IL); Arye Ziklik, Sunnyvale; Cuong Quoc Trinh, Milipitas, both of CA (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/097,022

(22) Filed: Jun. 12, 1998

(51) Int. Cl.[7] .............................................. G01R 31/28
(52) U.S. Cl. ...................................... 714/734; 714/733
(58) Field of Search ........................... 326/41; 709/246; 702/186; 365/189.04; 714/734, 725, 727, 733

(56) References Cited

U.S. PATENT DOCUMENTS 5,465,056 A * 11/1995 Hsieh et al. .................. 326/41
5,689,516 A * 11/1997 Mack et al. .................. 714/725
5,694,399 A * 12/1997 Jacobson et al. ............. 709/246
5,768,152 A * 6/1998 Battaline et al. ............. 702/186
5,940,603 A * 8/1999 Huang .................... 365/189.04
5,968,196 A * 10/1999 Ramamurthy et al. ....... 714/727

FOREIGN PATENT DOCUMENTS

EP 0639006 2/1995
FR 2753274 2/1998

* cited by examiner

Primary Examiner—David Ton
(74) Attorney, Agent, or Firm—Lisa K. Jorgenson; Andre M. Szuwalski

(57) ABSTRACT

A memory chip which uses a multi-pin port as a JTAG port includes a JTAG controller, at least one internal block and a configuration unit which selectively configures four pins of the multi-pin port to communicate JTAG data to the JTAG controller or to communicate non-JTAG data to the at least one internal block. The configuration unit can be generally permanent or it can be modifiable. For example, the modifiable configuration unit can be a volatile memory (VM) configuration unit or a product term output of a programmable logic device (PLD).

20 Claims, 3 Drawing Sheets

GENERAL PORT CAPABLE OF IMPLEMENTING THE JTAG PROTOCOL

FIELD OF THE INVENTION

The present invention relates to Joint Text Action Group (JTAG) ports generally.

BACKGROUND OF THE INVENTION

Memory units are very common in many different types of products. All memory units are programmable but the types of memory units differ in whether or not and how they are erased. Read only memory (ROM) units are not erasable and require replacement if the information programmed therein must be changed. Erasable programmable, read only memory (EPROM) units use electrical signals to program them but require ultraviolet light to erase the entire chip at once. Electrically erasable programmable, read only memory (EEPROM) units and FLASH EEPROM units use electrical signals for erasing and for programming. Thus, a single bit or a single word can be changed if desired.

Included in the term "memory units" are programmable logic devices (PLDs) which, instead of storing data as do memory units, store logical equations. A PLD can be based on any of the memory unit types.

To reprogram a programmable memory unit, the unit must be placed into a programming device which erases the unit in the appropriate manner and then electrically programs the unit. For memory units formed in a chip which is connected to a circuit board via a socket, this is not a problem since the units are typically removable from the socket.

However, those units which are directly soldered to the circuit board and those which are formed within a multi-function chip cannot be removed to the programming device. These units can be operated on (i.e. read, programmed, erased, verified, etc.) via a parallel port.

In-system programming (ISP) provides a method of operating on an on-chip memory unit, or any non-removable memory unit. IEEE Standard 1149.1 defines a test access port, known as a "JTAG port", through which in-system programming occurs using a serial channel. FIG. 1, to which reference is now made, illustrates a personal computer (PC) 10 having a parallel port 11 which controls a memory chip 12 having a JTAG port 14 and a plurality of general ports 15.

In order to operate with a JTAG port, the memory chip 12 must also have a JTAG controller 16 which converts the serial data transmitted through the JTAG port 14 to the parallel format needed for accessing the memory unit, labeled 18, via a parallel bus 20. The bus can either be a single bus for data and address signals or two busses, one for data signals and one for address signals. In addition, the JTAG controller 16 decodes the instructions sent to into control signals for controlling the operation of the memory unit 18. These control signals are provided to the memory unit 18 via a control bus 29.

The JTAG port 14 has four pins, one each for the clock signal TCK, a control signal TMS, a data in signal TDI and a data out signal TDO. The data in signal TDI is a serial presentation of the data and address information to be provided to the memory unit 18 as well as of the instructions to the memory unit 18. JTAG controller 16 converts the received data to a parallel format for presentation to the memory unit 18. The parallel format includes data, address and instruction information.

Although not shown, the general ports 15 are also connected to PC 10 or to other devices on the board and are used for accessing the memory unit 18 and any other elements on the memory chip 12. In general, the general ports 15 are eight pin ports and are in steady use while the JTAG port 14 is only used when the data in the memory unit 18 must be changed.

SUMMARY OF THE INVENTION

An object of the present invention is to use a general port as a JTAG port.

Applicants have realized that there is no need for a separate, dedicated JTAG port. Instead, a part of a general, eight-pin port can be configured to accept the JTAG data and provide it to the JTAG controller 16.

There is therefore provided, in accordance with a preferred embodiment of the present invention, a memory chip which uses a multi-pin port as a JTAG port. The chip includes a JTAG controller, at least one internal block and a configuration unit which selectively configures four pins of one of the multi-pin ports of the chip to communicate JTAG data to the JTAG controller or to communicate non-JTAG data to the at least one internal block.

Additionally, in accordance with a preferred embodiment of the present invention, the configuration unit can be generally permanent or it can be modifiable. For example, the modifiable configuration unit can be a volatile memory (VM) configuration unit or a product term output of a programmable logic device (PLD).

Moreover, in accordance with a preferred embodiment of the present invention, the memory chip also includes a flip-flop for acquiring the output of the modifiable configuration unit and for providing the output to the selected multi-pin port, wherein a reset input of the flip-flop is connected to an output line of the JTAG controller.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Applicants have realized that there is no need for a separate, dedicated JTAG port. Instead, a part of a general, multi-pin port, such as an eight-pin port, can be selectively configured to accept the JTAG data and provide it to the JTAG controller 16.

Figure 1:
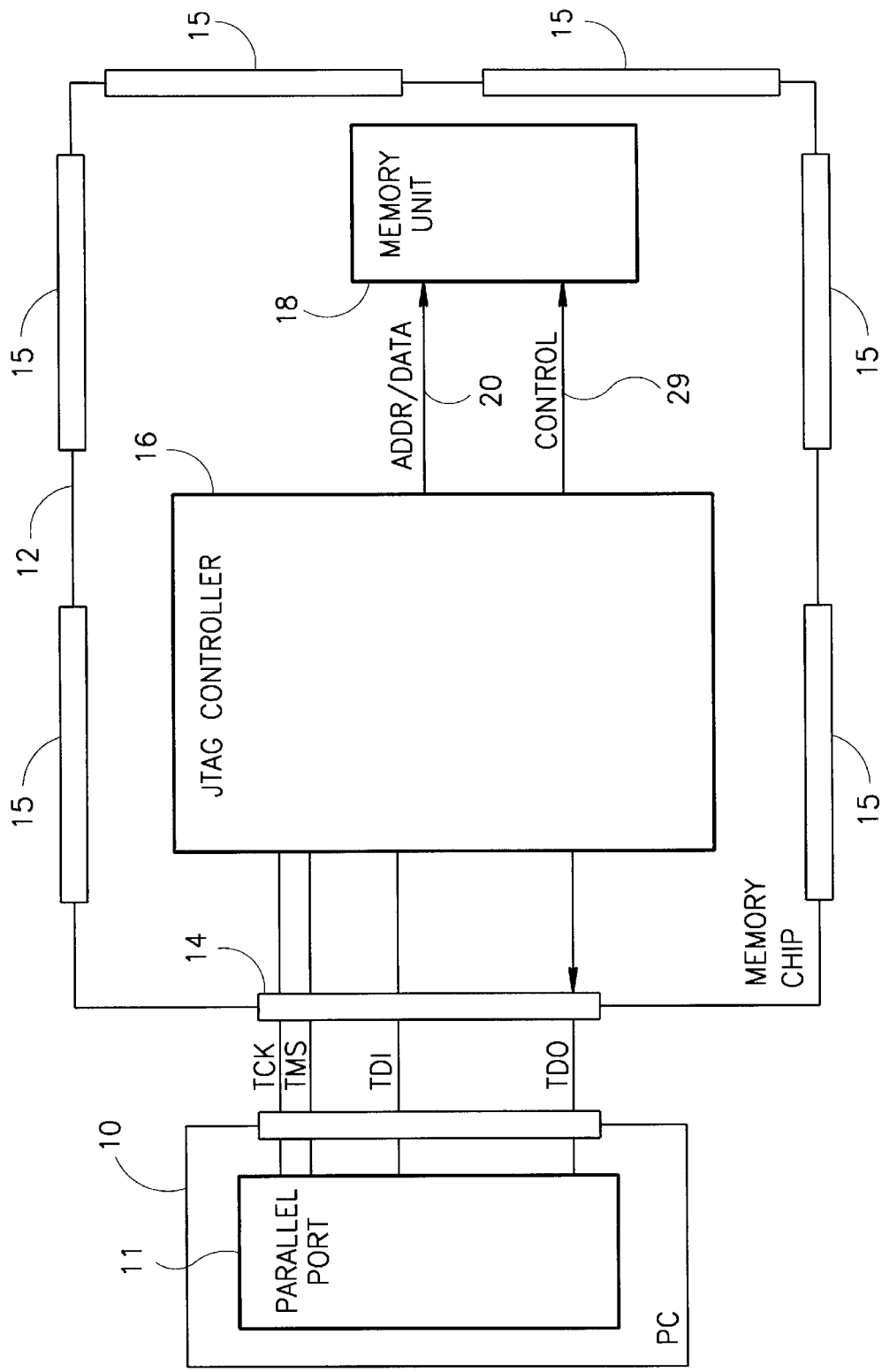
FIG. 1 is a schematic illustration of a prior art memory chip and a PC.
Figure 2:
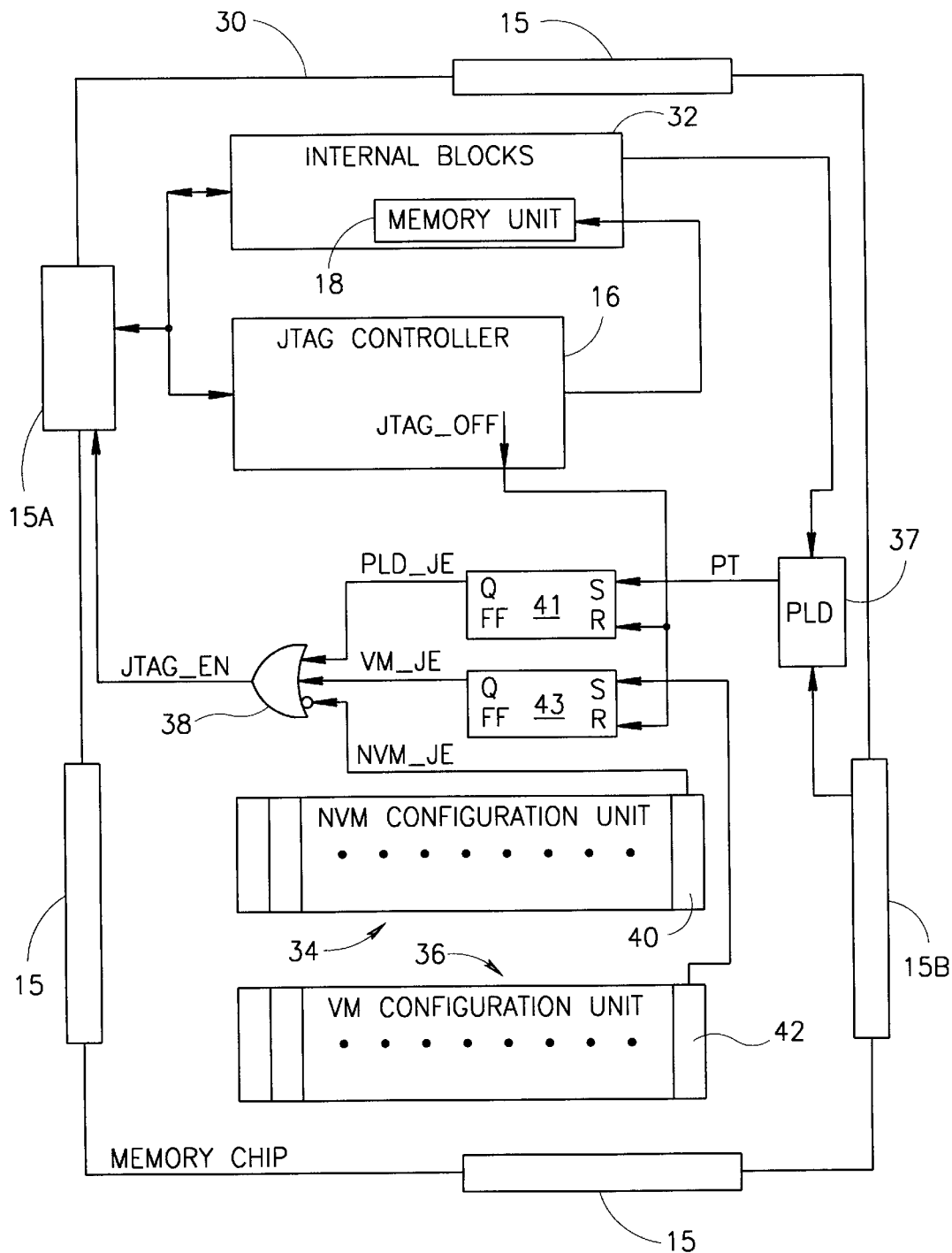
FIG. 2 is a schematic illustration of a memory chip, constructed and operative in accordance with a preferred embodiment of the present invention, in which a general port is selectively operable as a JTAG port.

Reference is now made to FIG. 2 which illustrates a memory chip 30 with multiple general ports 15, JTAG controller 16 and internal blocks 32, where internal blocks 32 can be any type of internal block, including memory unit 18. In accordance with a preferred embodiment of the present invention, the general port labeled 15A is configurable to perform as a JTAG port or as an input and/or output port for the internal blocks 32. Accordingly, memory chip 30 also comprises at least one configuration unit which defines the general vs. JTAG operation of the port 15A.

The configuration can be generally permanent, using a configuration unit 34 formed of non-volatile memory (NVM) or it can be easily modifiable. The latter is provided either by a configuration unit 36 formed of volatile memory (VM) or a programmable logic device (PLD) 37 one product term (PT) of which provides a configuration signal. The output of modifiable configuration elements 36 and 37 should be latched and thus, FIG. 2 shows flip-flops 41 and 43 which receive the output of modifiable configuration elements 37 and 36, respectively, at their S input.

The output of flip-flops 41 and 43 (e.g. the signals labeled PLD_JE and VM_JE) and that of NVM configuration unit 34 (e.g. the signal labeled NVM_JE) is provided to an OR gate 38. The output of OR gate 38, labeled JTAG_EN, is JTAG enable signal used to configure port 15A.

As will be discussed in more detail hereinbelow, when JTAG operation is desired, four of the pins of port 15A provide signals to and from JTAG controller 16 and the remaining pins operate with the internal blocks 32. Otherwise, all of the pins of port 15A operate with internal blocks 32.

The NVM configuration bit 40 is typically configured prior to operation of the chip 30 and not changed during operation. NVM configuration unit 34 receives its configuration through programming of its bits in one of two ways, either via an external programmer using high voltage or via parallel programming using low voltage and under control of an external processor. For ease of use, the default, non-programmed (i.e. low) state of bit 40 activates port 15A to be a JTAG port. However, the opposite can also be true.

Whenever an external processor, such as PC 10, wishes to program the memory unit 18 using the JTAG protocol, the external processor writes into the bit 42 of VM configuration unit 36. In order to change port 15A to be a JTAG port, the external processor must write a high value into bit 42 followed by a low value. The presence of the high value in the set (S) input of flip-flop 41 will set the output Q of flip-flop 43 to a high value. The change to the low value will not affect the output of flip-flop 43.

In order to cancel the JTAG port configuration, the external processor serially sends a "JTAG_OFF" instruction to JTAG controller 16. In response, the JTAG controller 16 pulses a JTAG_OFF signal, thereby to deactivate JTAG controller 16. As shown in FIG. 2, the JTAG_OFF signal is connected to the reset R input of flip-flop 43. When the JTAG_OFF signal is high, it resets the output Q of flip-flop 43 to a low value.

PLD 37 receives input signals from either or both of the general ports (FIG. 2 shows input from port 15B) and the internal blocks 32 and performs logical equations thereon. One of the product terms (PT) produced by PLD 37 can be used to configure port 15A. The product term PT is connected to the set S input of flip-flop 41 and the JTAG_OFF signal is connected to the reset R input of flip-flop 41. Thus, flip-flop 41 operates as described for flip-flop 43, activating the JTAG port configuration when the product term PT goes high and deactivating it when the JTAG_OFF signal goes high.

Because the activation state for NVM configuration unit 34 is different than that for VM configuration unit 36 and PLD 37, the value of NVM bit 40 is inverted before OR gate 38. This is indicated in FIG. 2 by the circle on the signal from NVM bit 40.

It will be appreciated that the modifiable configuration units 36 and 37 provide the present invention with the ability to change the operation of the general port 15A as desired and temporarily. The PLD 37 enables the present invention to change the operation of port 15A when specific conditions occur, as defined by the logical equations implemented therein while the VM configuration unit 36 enables the external processor change port 15A whenever it so desires.

Figure 3:
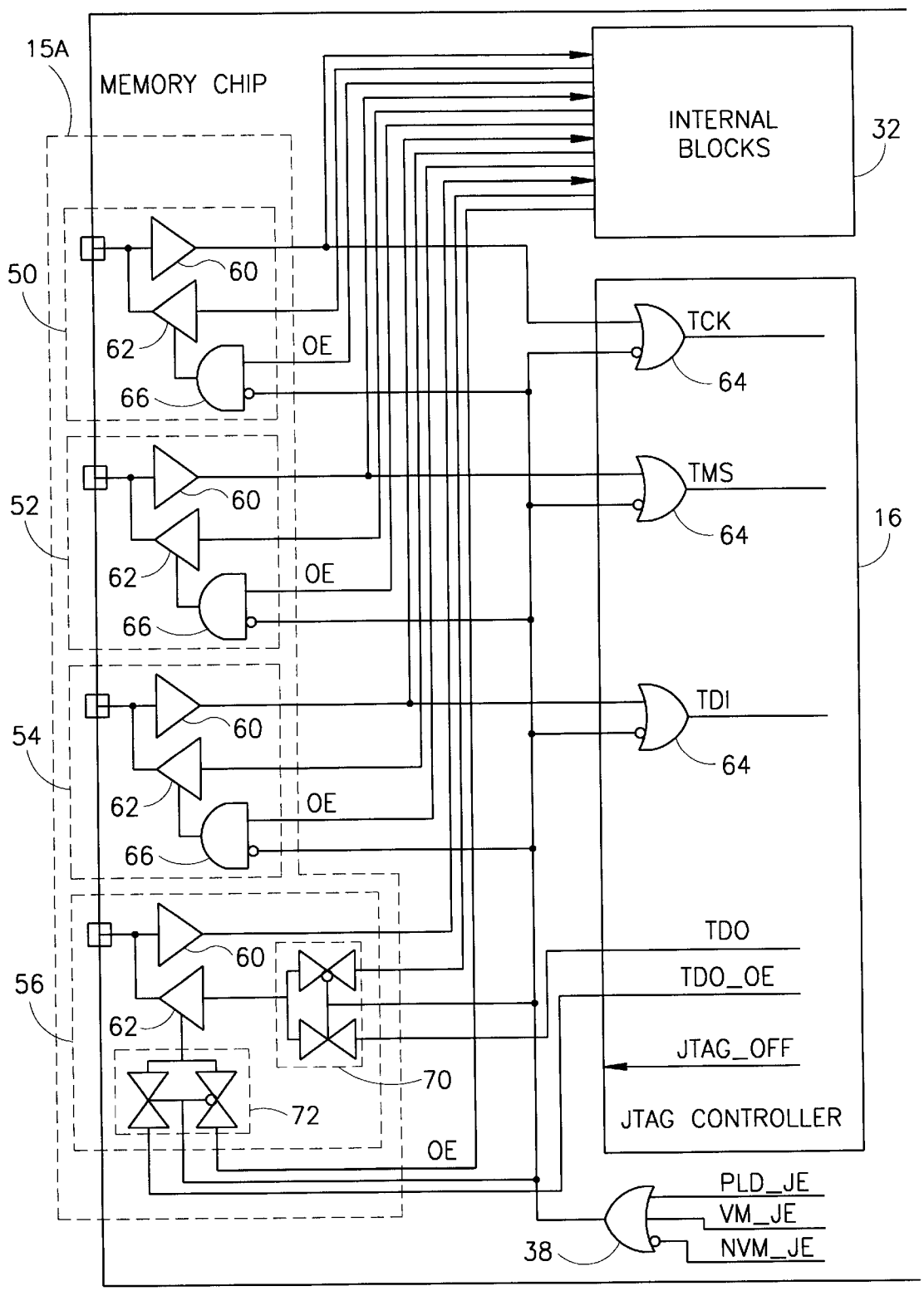
FIG. 3 is a detailed schematic illustration of the selectable general port.

Reference is now made to FIG. 3 which details the logic of port 15A and the connections of four pins 50, 52, 54 and 56 of port 15A to JTAG controller 16 and to internal blocks 32. For clarity, the remaining pins of port 15A are not shown. In FIG. 3, each pin 50–56 is shown operative as both an input and an output pin. It will be appreciated that the present invention includes dedicated input pins and dedicated output pins as well.

Each pin 50, 52 and 54 is connected both to internal blocks 32 and to JTAG controller 16 and comprises an input buffer 60 and an output buffer 62. Input buffer 60 provides an input signal to either the internal blocks 32 or to JTAG controller 16. To ensure that the JTAG controller 16 only uses the input signal when so selected, the input buffer 60 is connected to an OR gate 64 which also receives and inverts the JTAG_EN output of OR gate 38.

As long as the JTAG_EN signal is high (i.e. the input to the OR gate 64 is low), the JTAG controller 16 will operate. If the JTAG_EN signal is low, the output of each OR gate 64 will be high and, in accordance with the JTAG protocol, the JTAG controller 16 will be in the reset state (i.e. disabled). The internal blocks 32 will always receive the input signal from the input buffer 60 but should not affect the operation of the JTAG controller 16. If they do affect the operation of the JTAG controller 16, then the internal blocks 32 should be blocked using the JTAG_EN signal.

The output buffer 62 receives an output signal from the internal blocks 32. The output signal will be provided out only if the output buffer 62 receives an output enable (OE) signal. For this purpose, pins 50, 52 and 54, which respectively provide the input signals TCK, TMS and TDI to the JTAG controller 16, also include an AND gate 66 which ANDs the JTAG_EN output of OR gate 38 and the relevant output enable signal from the internal blocks 32. As long as the JTAG operation is not enabled (i.e. JTAG_EN is low), AND gate 66 will pass the OE signal from the internal blocks 32. However, if the JTAG operation is enabled, AND gate 66 will not pass the OE signal and thus, the output buffer 62 will be deactivated.

Pin 56 which is connected to the TDO output of JTAG controller 16 has a different structure. As the other pins, it also includes input buffer 60 and output buffer 62. The input buffer 60 is connected only to the internal blocks 32 and the control of output buffer 62 is different. For this purpose, pin 56 additionally comprises a data multiplexer (MUX) 70 and an output enable MUX 72.

Data MUX 70 receives an output signal from the internal blocks 32 and the TDO data out signal from the JTAG controller 16 and is controlled by the JTAG_EN signal of OR gate 38. Thus, data MUX 70 selects between the TDO data out signal and the output signal of internal blocks 32, providing the TDO signal only when the JTAG EN signal is high.

Output enable MUX 72 receives an OE output enable signal from the internal blocks 32 and the TDO_OE enable signal from the JTAG controller 16 and is also controlled by the JTAG_EN signal. Thus, output enable MUX 72 selects between the TDO_OE and the OE signals, providing the TDO_OE signal only when the JTAG_EN signal is high.

Thus, the TDO signal can only be provided out if a) the TDO_OE is active and b) the JTAG_EN signal is high.

It will be appreciated that pins 50–54 can be input pins while pin 56 can be an output pin. In this alternative embodiment, pins 50–54 do not include their output buffers 62 nor their AND gates 66 and pin 56 does not include its input buffer 60.

It will be appreciated that the logical elements needed to implement the present invention are small and include only OR gates 38 and 64, AND gates 66 and MUXs 70 and 72.

It will be appreciated by persons skilled in the art that the present invention is not limited by what has been particularly shown and described herein above. Rather the scope of the invention is defined by the claims that follow.

What is claimed is:

1. A circuit chip comprising:
    a general port having a plurality of pins therein including a first set of pins and a second, different, set of pins;
    a JTAG controller connectable to the general port;
    an internal block connectable to the general port;
    a configuration unit operable to selectively configure the first set of pins in the general port to act as a JTAG port connected to the JTAG controller while the second set of pins is connected to the internal block to enable data communication therebetween, and to alternatively selectively configure the first and second set of pins in the general port to act as an input/output port connected to the internal block to enable data communication therebetween.

2. The circuit chip of claim 1, wherein the first set of pins comprises four JTAG pins.

3. The circuit chip of claim 1, wherein the general port includes eight pins, and the first and second set of pins are four pins each.

4. The circuit chip of claim 1, wherein the configuration unit includes at least one of a non-volatile memory configuration unit, a volatile memory configuration unit and a programmable logic device having a product term that provides a configuration signal.

5. The circuit chip of claim 1, wherein the internal block comprises a memory unit.

6. The circuit chip of claim 1, wherein the configuration unit further comprises:
    a preprogrammed non-volatile memory configuration element;
    a volatile memory configuration element operable to receive input from an external processor;
    a programmable logic device operable to receive inputs from the external processor and the internal blocks and performs logical equation manipulation thereon;
    a flip-flop circuitry, including at least two flip-flops and a gate, for receiving signals from the volatile memory configuration element, the programmable logic device, the preprogrammed non-volatile memory configuration element and the JTAG controller and based on the received signals sends an enable signal which configures the first set of pins in the general port to act as the JTAG port.

7. The circuit chip of claim 1, wherein the configuration unit further comprises:
    a preprogrammed non-volatile memory configuration element;
    a volatile memory configuration element operable to receive input from an external processor;
    a programmable logic device operable to receive inputs from the external processor and the internal blocks and performs logical equation manipulation thereon;
    a first flip-flop for receiving an output of said volatile memory configuration element, said first flip-flop including a reset input connected to an output line of the JTAG controller;
    a second flip-flop for receiving an output of said programmable logic device, said second flip-flop including a reset input connected to the output line of the JTAG controller; and
    a logic gate for logically combining an output of the first and second flip-flops along with an output of the preprogrammed non-volatile memory configuration element and generating an enable signal therefrom which configures the first set of pins in the general port to act as the JTAG port.

8. A method for configuring a general port within a circuit chip comprising the steps of:
    selectively configuring a first set of pins in the general port to act as a JTAG port and a second, different, set of pins in the general port to act as an input/output port for connection to an internal block to enable communication therebetween; and
    alternatively selectively configuring both the first and second set of pins in the general port to act as the input/output port for connection to the internal block to enable communication therebetween.

9. The method of claim 8, further comprising the step of:
    receiving a signal from an external processor for enabling the configuring of the general port.

10. The method of claim 8, wherein the selectively configuring step further comprises the steps of:
    providing a flip-flop circuitry with a first signal indicative of a logical value of a volatile memory configuration element and a configuration signal indicative of a product term of a logical equation; and
    sending an enable signal to the general port to set the first set of pins in the general port to act as a JTAG port.

11. The method of claim 10, wherein the selectively configuring step further comprises, prior to the step of sending, the step of:
    logically combining two output signals of the flip-flop circuitry and a second signal indicative of a logical value of a non-volatile memory configuration element and forming the enable signal therefrom.

12. The method of claim 10, further comprising the step of:
    receiving, by the flip-flop circuitry, a reset signal, wherein the step of sending the enable signal to the general port deactivates the first set of pins in the general port to act as a JTAG port and configures both the first and second set of pins in the general port to act as the input/output port to the internal block.

13. A memory chip comprising:
    a plurality of general ports each having a plurality of pins therein including a first set of pins and a second set of pins;
    a JTAG controller connectable to at least one of the plurality of general ports;
    an internal block connectable to the same at least one of the plurality of general ports;
    a configuration unit operable to configure the first set of pins in the general port to act as a JTAG port for connection to the JTAG controller while the second set of pins in the same general port is connected to the internal block to enable data communication therebetween.

14. The memory chip of claim 13, wherein the configuration unit is operable to alternatively configure the first and second set of pins in the same general port to act as an input/output port for connection to the internal block to enable data communication therebetween.

15. The memory chip of claim 13, wherein the first set of pins comprises four JTAG pins.

16. The memory chip of claim 13, wherein each of the plurality of general ports include eight pins, and the first and second set of pins are four pins each.

17. The memory chip of claim 13, wherein the internal block comprises a memory unit.

18. The memory chip of claim 13, wherein the configuration unit further comprises a non-volatile memory configuration unit, a volatile memory configuration unit and a programmable logic device having a product term that provides a configuration signal.

19. The memory chip of claim 13, wherein the configuration unit further comprises:

a volatile memory configuration element;

a programmable logic device operable to performs logical equation manipulation; and at least two flip-flops for receiving a first signal indicative of the logic value of a first bit of the volatile memory configuration element, a second signal indicative of a product term of the programmable logic device and a third signal indicative of the JTAG controller state.

20. The memory chip of claim 19, wherein said configuration unit comprises:

a preprogrammed non-volatile memory configuration element; and a logic gate for receiving a fourth signal indicative of the logic value of a first bit of the non-volatile memory configuration element, outputs of the at least two flip-flops and logically combining the fourth signal and the outputs of the at least two flip-flops to generate an enable signal that either configures the first set of pins in the at least one of the plurality of general ports to act as the JTAG port or alternatively configures the first and second set of pins in the general port to act as an input/output port connected to the internal block.

* * * * *